(12) United States Patent
Xu et al.

(10) Patent No.: US 11,615,008 B2
(45) Date of Patent: Mar. 28, 2023

(54) TEMPERATURE AND INTER-PULSE DELAY FACTORS FOR MEDIA MANAGEMENT OPERATIONS AT A MEMORY DEVICE

(71) Applicant: Micron Technology, Inc., Boise, ID (US)

(72) Inventors: Zhongguang Xu, San Jose, CA (US); Fangfang Zhu, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 17/304,316

(22) Filed: Jun. 17, 2021

(65) Prior Publication Data

US 2022/0405181 A1     Dec. 22, 2022

(51) Int. Cl.
*G06F 11/00* (2006.01)
*G06F 11/30* (2006.01)
(Continued)

(52) U.S. Cl.
CPC ........ *G06F 11/3037* (2013.01); *G06F 11/076* (2013.01); *G06F 11/1016* (2013.01); *G06F 11/3058* (2013.01); *G06F 12/0238* (2013.01); *G11C 16/3404* (2013.01); *G11C 16/3495* (2013.01); *G06F 2212/7209* (2013.01); *G06F 2212/7211* (2013.01)

(58) Field of Classification Search
CPC ............. G06F 11/0703; G06F 11/0706; G06F 11/0727; G06F 11/073; G06F 11/0751; G06F 11/0754; G06F 11/076; G06F 11/1008; G06F 11/1012; G06F 11/1016; G06F 11/3003; G06F 11/3037; G06F 11/3058; G06F 12/0223; G06F 12/023; G06F 12/0238; G06F 12/0246; G06F 2212/7209; G06F 2212/7211; G11C 16/3404; G11C 16/3495
See application file for complete search history.

(56) References Cited

U.S. PATENT DOCUMENTS

| | | | |
|---|---|---|---|
| 10,573,397 B1 * | 2/2020 | Sehgal | ................ G11C 11/5628 |
| 2012/0023144 A1 * | 1/2012 | Rub | .................... G06F 12/0246 |
| | | | 711/E12.008 |

(Continued)

OTHER PUBLICATIONS

Song, Shihao, Anup Das, Onur Mutlu, and Nagarajan Kandasamy. "Aging-aware request scheduling for non-volatile main memory." In Proceedings of the 26th Asia and South Pacific Design Automation Conference, pp. 657-664. 2021. (Year: 2021).*

*Primary Examiner* — Anthony J Amoroso
(74) *Attorney, Agent, or Firm* — Lowenstein Sandler LLP

(57) ABSTRACT

An average inter-pulse delay of a data unit of the memory device is calculated. An average temperature of the data unit is calculated. A first scaling factor based on the average inter-pulse delay and a second scaling factor based on the average temperature is obtained. A media management metric based on the first scaling factor and the second scaling factor is calculated. Responsive to determining that the media management metric satisfies a media management criterion, a media management operation on the data unit at a predetermined cycle count is performed.

20 Claims, 6 Drawing Sheets

(51) Int. Cl.
*G06F 12/02* (2006.01)
*G06F 11/07* (2006.01)
*G11C 16/34* (2006.01)
*G06F 11/10* (2006.01)

(56) References Cited

U.S. PATENT DOCUMENTS

| | | | |
|---|---|---|---|
| 2014/0101371 A1* | 4/2014 | Nguyen | G06F 1/206 |
| | | | 711/103 |
| 2019/0066818 A1* | 2/2019 | Lee | G11C 29/50012 |
| 2022/0199183 A1* | 6/2022 | Steiner | G11C 29/42 |

* cited by examiner

| Temperature | IPD | $f_{bd}$ | $f_T$ |
|---|---|---|---|
| T0 | t0 | 1 | 1 |
| T0 | t1 | α0 | β0 |
| T0 | t2 | α1 | β1 |
| T0 | t3 | α2 | β2 |
| T0 | t4 | α3 | β3 |
| T0 | t5 | α4 | β4 |
| T0 | t6 | α5 | β5 |
| T0 | t7 | α6 | β6 |
| T1 | t0 | α7 | β7 |
| T1 | t1 | α8 | β8 |
| T1 | t2 | α9 | β9 |
| T1 | t3 | α10 | β10 |
| T1 | t4 | α11 | β11 |
| T1 | t5 | α12 | β12 |
| T1 | t6 | α13 | β13 |
| T1 | t7 | α14 | β14 |
| T2 | t0 | α15 | β15 |
| T2 | t1 | α16 | β16 |
| T2 | t2 | α17 | β17 |
| T2 | t3 | α18 | β18 |
| T2 | t4 | α19 | β19 |
| T2 | t5 | α20 | β20 |
| T2 | t6 | α21 | β21 |
| T2 | t7 | α22 | β22 |
| T3 | t0 | α23 | β23 |
| T3 | t1 | α24 | β24 |
| T3 | t2 | α25 | β25 |
| T3 | t3 | α26 | β26 |
| T3 | t4 | α27 | β27 |
| T3 | t5 | α28 | β28 |
| T3 | t6 | α29 | β29 |
| T3 | t7 | α30 | β30 |
| T4 | t0 | α31 | β31 |
| T4 | t1 | α32 | β32 |
| T4 | t2 | α33 | β33 |
| T4 | t3 | α34 | β34 |
| T4 | t4 | α35 | β35 |
| T4 | t5 | α36 | β36 |
| T4 | t6 | α37 | β37 |
| T4 | t7 | α38 | β38 |
| T5 | t0 | α39 | β39 |
| T5 | t1 | α40 | β40 |
| T5 | t2 | α41 | β41 |
| T5 | t3 | α42 | β42 |
| T5 | t4 | α43 | β43 |
| T5 | t5 | α44 | β44 |
| T5 | t6 | α45 | β45 |
| T5 | t7 | α46 | β46 |

FIG. 2B

TEMPERATURE AND INTER-PULSE DELAY FACTORS FOR MEDIA MANAGEMENT OPERATIONS AT A MEMORY DEVICE

TECHNICAL FIELD

Embodiments of the disclosure relate generally to memory sub-systems, and more specifically, relate to temperature and inter-pulse delay factors for media management operation at a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A-2B illustrates a graph and a look-up table to determine a temperature factor and inter-pulse delay factor for a media management metric, in accordance with some embodiments of the present disclosure.

DETAILED DESCRIPTION

Figure 1:
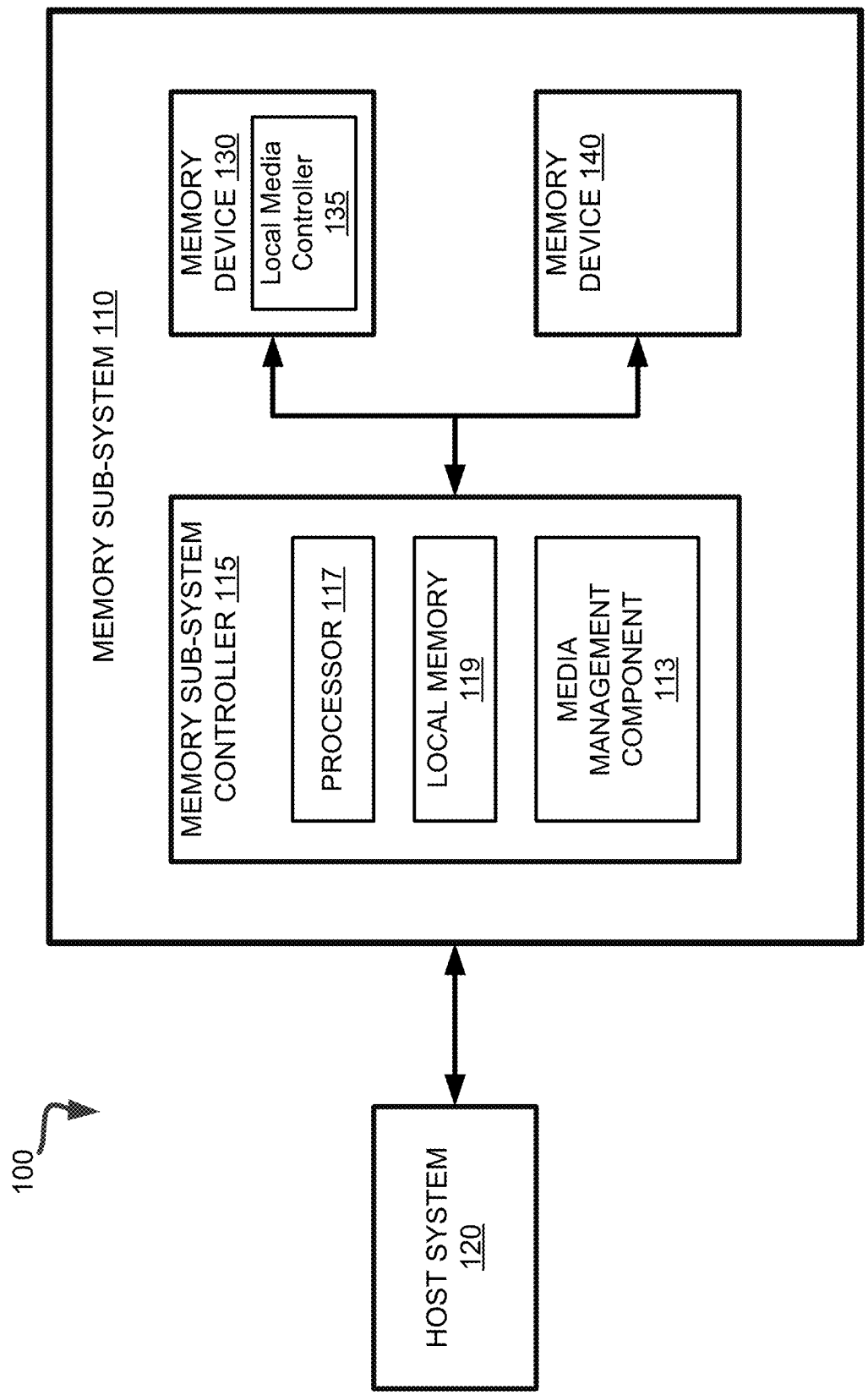
FIG. 1 illustrates an example computing system that includes a memory sub-system in accordance with some embodiments of the present disclosure.

Aspects of the present disclosure are directed to temperature and inter-pulse delay factors for media management operation at a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Memory devices at a memory sub-system can have particular properties that provide challenges in the operation of the memory sub-system. Some memory devices, such as non-volatile memory devices, can have limited endurance. For example, some memory devices can be written, read, or erased a finite number of times before the memory devices begin to physically degrade or wear and eventually fail.

A memory sub-system controller can perform media management operations to mitigate the amount of physical wear on the memory devices and lengthen the overall lifetime of the memory sub-system. For example, the memory sub-system controller can perform a media management operation (e.g., a wear leveling operation) to distribute the physical wear across data units of a memory device. A data unit refers to a particular amount of memory, such as a page or a block, of a memory device. To perform a media management operation, the memory sub-system controller can identify a data unit at a memory device that is subject to a significant amount of physical wear and can move data stored at the data unit to another data unit subject to a smaller amount of physical wear. In some instances, a data unit can be subject to a significant amount of physical wear if a large number of memory access operations, such as write operations (i.e., program operations) or read operations, are performed at the data unit. As such, in conventional systems, the memory sub-system controller can identify data units that are subject to large amounts of physical wear based, for example, on write counts for each data unit. A write count refers to a number of times that the memory sub-system controller performs a write operation at a particular data unit over the lifetime of the particular data unit.

In some instances, a data unit can also be subject to a significant amount of physical wear if a large number of read and/or write operations are performed at the data unit. Read and/or write operations performed at the data unit are not the sole cause of physical wear operations, however, as other factors can contribute to the physical wear of the data unit, such as, for example an interval between cycles (e.g., inter-pulse delay) and temperature. Inter-pulse delay can impact the voltage stored in and read from the memory cell the longer data is stored on a particular data unit without being refreshed by a media operation. As such, higher temperatures and longer inter-pulse delays can cause the data units to experience significantly more physical wear.

Some conventional memory sub-system controllers can identify data units that are subject to large amounts of physical wear based read and/or write cycle counts. The amount of physical wear caused by temperatures and inter-pulse delays are not considered by the memory sub-system controller in determining whether to initiate a media management operation (e.g., wear leveling operation, or write scrub). Media management operations are performed regularly on the memory sub-system to facilitate uniform usage of the data units. Media management operations utilize read and/or write counts to determine when to perform media management operations. If the memory sub-system controller does not initiate a media management operation at a data unit that is subject to a significant amount of wear due to high temperatures and/or long inter-pulse delay despite having small number of read and/or write operations (e.g., small read and/or write cycle counts), the data unit can fail sooner. Eventually, the data unit can become corrupted and data stored at the data unit becomes unreliable. The data unit can, therefore, be unstable, reducing the overall efficiency and increasing the overall latency of the memory sub-system.

Aspects of the present disclosure address the above and other deficiencies by having a memory sub-system that enables a controller to incorporate a temperature factor and an inter-pulse delay factor to determine whether to perform a media management operation at a data unit of a memory device. A temperature factor refers to a factor based on a temperature of a data unit during a set/reset cycling operation. An inter-pulse delay factor refers to a factor based on the inter-pulse delay of a data unit during a set/reset cycling operation. Accordingly, in addition to the amount of physical wear caused by set/reset cycling count (e.g., write or programming cycling count) and read cycling count, the amount of physical wear caused by an average inter-pulse delay based on the inter-pulse delay that occurred during each set/reset cycling count since the previous media management operation and the average temperature of the data unit based on the temperature recorded during each set/reset cycling count since the previous media management operation is factored into the overall physical wear of the data unit at the memory device. The overall physical wear of the data unit at the memory device can be represented as a media management metric (e.g., current age value) of the data unit at the memory device. The media management metric refers to the addition of a product of the set/reset cycling count, the temperature factor, and the inter-pulse delay factor (e.g., set/reset cycling count*temperature factor*inter-pulse delay) and a product of a read cycling count and a wear ratio between read and write operation (e.g., applying a scaling factor to the read cycling counts due to disproportionate effects between read and write operations on the data unit). Accordingly, based on the media management metric of the data unit, the memory sub-system controller can determine when to perform media management operation at the data unit of the memory device.

Advantages of the present disclosure include, but are not limited to, an increase in an overall lifetime of a memory sub-system by more accurately performing media management operation on the memory sub-system (e.g., avoiding unnecessary media management operation and/or insufficient media management operation). By calculating a media management metric based on a number of write operation (set/reset operation), a number of read operation, a temperature factor, and an inter-pulse delay factor, the memory sub-system controller considers an amount of physical wear to a data unit caused by a temperature factor and an inter-pulse delay factor as well as a write operation (e.g., set/reset operation) and a read operation. The memory sub-system controller, therefore, performs a media management operation for a data unit that is subject to physical wear caused by read operations and write operations (e.g., set/reset operation) including temperature and inter-pulse delay effects on the write operations. Additionally, by using the media management metric, the memory sub-system controller is able to more accurately identify data units that are subject to significant amounts of physical wear and initiate a media management operation. As a result, the number of unnecessary media management operations (or insufficient media management operations) for data units at a memory device decreases, which increases the amount of system resources available to other processes. The increase in available system resources results in an increase in overall sub-system efficiency and a decrease in overall sub-system latency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes media management component 113 that manages the performance of media management operations for memory devices 130, 140 during operation of memory sub-system 110. In some embodiments, the memory sub-system controller 115 includes at least a portion of the media management component 113. In some embodiments, the media management component 113 is part of the host system 110, an application, or an operating system. In other embodiments, local media controller 135 includes at least a portion of media management component 113 and is configured to perform the functionality described herein.

The media management component 113 can facilitate performing a media management operation at a data unit (e.g., a block, a page, etc.) at memory device 130, 140. A media management operation can include a wear leveling operation, a garbage collection operation, a folding operation, and so forth. It should be noted that, although some embodiments of the present disclosure are described with respect to a wear leveling operation, aspects of this disclosure can be applied to performing any media management operation (e.g., garbage collection operation, folding operation, etc.). Media management component 113 can perform a media management operation at a particular data unit in response to determining a media management metric associated with the data unit satisfies a media management criterion. The media management metric can be indicative of a level or amount of physical wear of the data unit at a particular instance in time. Media management component 113 can calculate a media management metric for a particular data unit based on a temperature factor, an inter-pulse delay factor, a number of write operations performed at the data unit, and a number of read operations performed at the data unit. As described previously, the temperature factor refers to a factor based on a temperature of a data unit during a set/reset cycling operation and an inter-pulse delay factor refers to a factor based on the inter-pulse delay of a data unit during a set/reset cycling operation. Media management component 113 can use the temperature factor and the inter-pulse delay factor to normalize the amount of physical wear caused by the number of write operations (e.g., set/reset operation) when calculating the media management metric. In response to determining the media management metric satisfies the media management criterion, media management component 113 can perform the media management operation at the data unit. Further details with regards to the operations of the media management component 113 are described below.

Figure 2A:
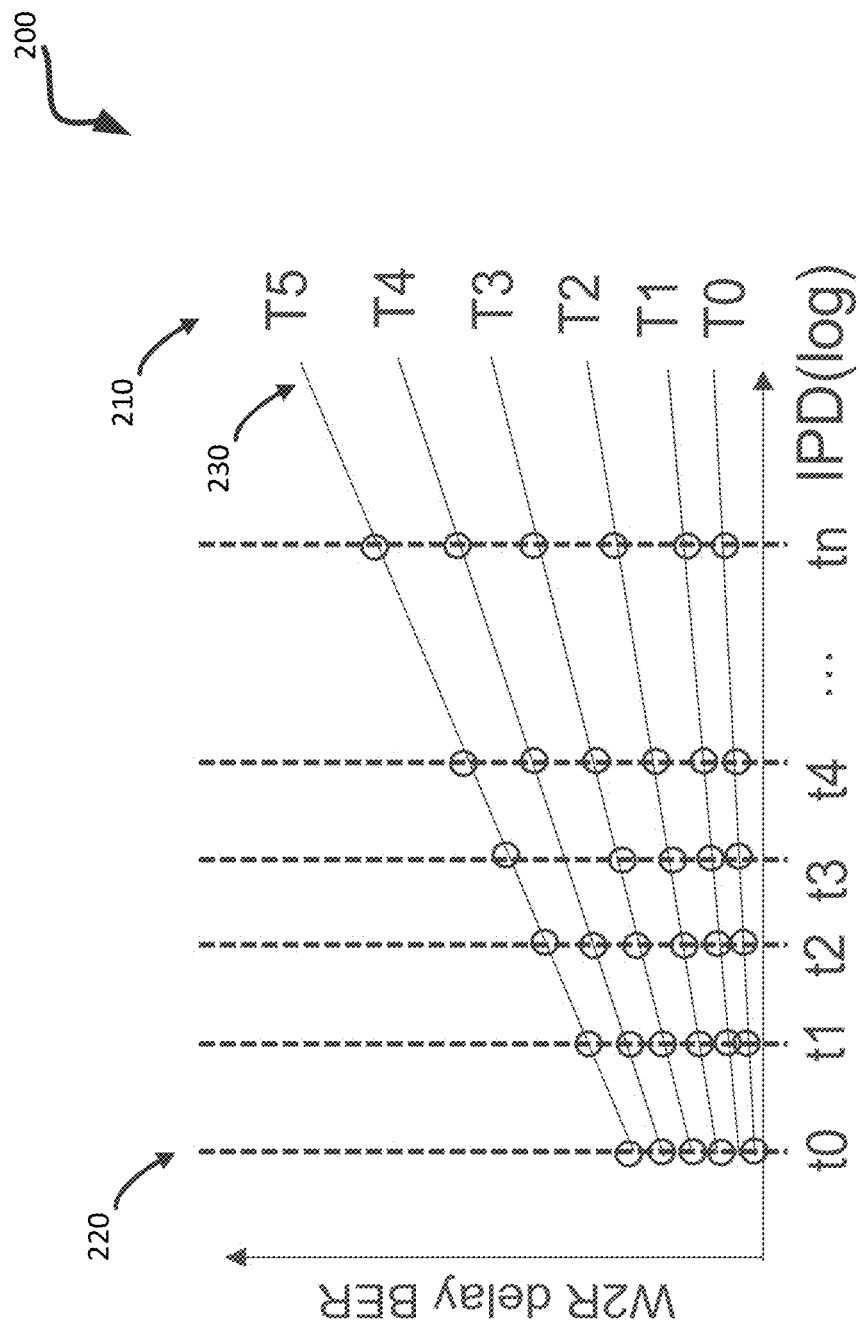

FIG. 2A is a graph 200 to determine a temperature factor and inter-pulse delay factor for a media management metric, in accordance with some embodiments of the present disclosure. Graph 200 provides a graph of a data unit 230 which indicates the amount of physical wear on data unit 230 with varying temperature values 210 and varying inter-pulse delay values 220. The graph 200 can be based on a large sample data set during manufacturing of the data unit. The amount of physical wear caused to data unit 230 can correspond to a measured bit error rate (e.g., BER) based on a predetermined write-to-read delay (e.g., 1 ms/1 minute). The inter-pulse delay values 220 are represented in logarithmic scale (e.g., inter-pulse delay (log)). The temperature 210 values can be varied based on the sensitivity of the temperature range on the BER of data unit 230, for example, graph 200 can be an incremental increase of 5° C. Based on the plotted BER with corresponding inter-pulse delay values 220 and temperature values 210, the memory sub-system controller 115 can generate a look-up table 250 (referring to FIG. 2B) by performing calculations to determine a weighted contributing factor (e.g., temperature factor 262 and inter-pulse delay factor 272) of a specific temperature value 210 and a specific inter-pulse delay value 220.

FIG. 2B illustrates a look-up table 250 to determine a temperature factor and inter-pulse delay factor for a media management metric, in accordance with some embodiments of the present disclosure. Look-up table 250 provides a table of multiple entries 280. Each entry 280 includes a temperature 260 which corresponds to a temperature value 210, an inter-pulse delay 270 which corresponds to an inter-pulse delay value 270, a temperature factor 262 (e.g., $\alpha 0$-$\alpha 46$) that corresponds to temperature 260, and an inter-pulse delay factor 272 (e.g., $\beta 0$-$\beta 46$) that corresponds to inter-pulse delay 270. Look-up table 250, as opposed to graph 200, can include an inter-pulse delay range t0 to t7 (e.g., 25 micro seconds to 10800 seconds (e.g., 3 hours)). The lower end of the range represents the shortest inter-pulse delay possible between set/reset cycles. The shortest inter-pulse delay can be considered a reference value for inter-pulse delay, as such, results in an inter-pulse delay factor of 1. The higher end of the range represents the longest inter-pulse delay possible between set/reset cycles. The longest inter-pulse delay can be based on a predetermined time period (e.g., 3 hours) a media management operation is to be performed to refresh the data at the data unit.

Look-up table 250 can include a temperature range T0 to T5 (e.g., 25° C. to 65° C.). However, as opposed to graph 200, the increments may vary in the look-up table 250. With lower temperatures the look-up table 250 may set temperature 260 to incrementally increase, for example, by 10° C. (e.g., the difference between T1 and T2 is 10° C.). With higher temperatures the look-up table 250 may set temperature 260 to incrementally increase, for example, by 5° C. (e.g., the difference between T4 and T5 is 5° C.). The differences in the incremental increase accounts for the sensitivity of higher temperatures on the data unit. The lower temperature of the range represents a reference temperature at which, absent an inter-pulse delay, the data unit is not affected by temperature, as such, results in a temperature factor of 1. The higher temperature of the range represents a reference temperature at which the data unit is able to operate without failure.

To determine an inter-pulse factor 272 and a temperature factor 262, a reference inter-pulse delay and a reference temperature are compared with the inter-pulse delay 270 and temperature 260 of an entry 280 of the look-up table, the entry 280 is selected if the reference inter-pulse delay and the reference temperature is equal to or greater than the inter-pulse delay 270 and temperature 260 of the entry 280. In the event that the reference inter-pulse delay and/or the reference temperature is less than the inter-pulse delay 270 of the entry 280 and/or the temperature 260 of the entry 280, the previous entry 280 of the look-up table in which the reference inter-pulse delay and the reference temperature is equal to or greater than the inter-pulse delay 270 and temperature 260 is selected.

Figure 3:
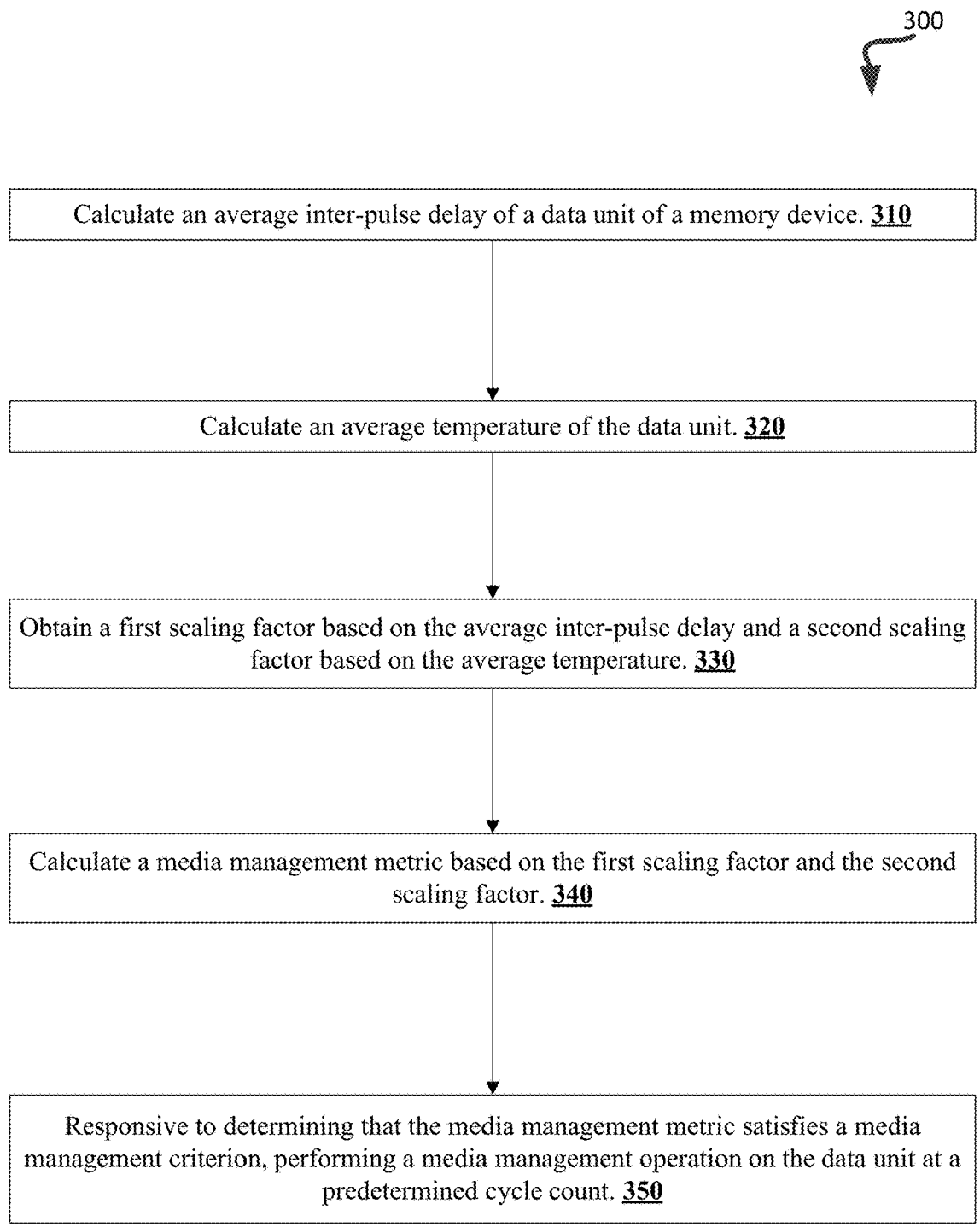
FIG. 3 is a flow diagram of an example method to identify a data unit of a memory device for performing a media management operation, in accordance with some embodiments of the present disclosure.

FIG. 3 is a flow diagram of an example method 300 to identify a data unit of a memory device for performing a media management operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic calculates an average inter-pulse delay of a data unit of a memory device. To calculate the average inter-pulse delay of the data unit, the processing logic obtains a first time stamp associated with a time stamp of a previous media management operation performed on the data unit and a second time stamp for each media access operation performed on the data unit. The second time stamp represents a time stamp of a media access operation performed after the first time stamp. Once the first time stamp and the second time stamp corresponding to each media access operation performed are obtained, the processing logic calculates an inter-pulse delay for each media access operation based on the first time stamp and the second time stamp of a respective media access operation. After each of the inter-pulse delay of each media access operation is calculated, the processing logic calculates an average inter-pulse delay of the data unit based on a number of media operation performed after the first time stamp and a sum of the inter-pulse delay for the respective media access operation. The sum of the inter-pulse delay is the total number of inter-pulse delay for all of the media access operation performed on the data unit of the memory device. The average inter-pulse delay of the data unit is the average duration between each cycle media access operation. The average inter-pulse delay represents typical interval between cycles of the data unit.

At operation 320, the processing logic calculates an average temperature of the data unit. To calculate an average temperature of the data unit, the processing logic obtains a plurality of temperature values of the data unit corresponding to a temperature reading performed on the data unit every predetermined time period. After obtaining the plurality of temperature values of the data unit, the processing logic calculates the average temperature based on a number temperature readings performed and a sum of the respective temperature values.

At operation 330, the processing logic obtains a first scaling factor based on the average inter-pulse delay and a second scaling factor based on the average temperature. To obtain the first scaling factor based on the average inter-pulse delay the processing logic identifies an entry of a look-up table corresponding to the average inter-pulse delay and extracts from the identified entry, the first scaling factor. To obtain the second scaling factor based on the average temperature, the processing logic identifies an entry of a look-up table corresponding to the average temperature and extracts from the identified entry, the second scaling factor. As described previously, the entry of the look-up table is selected if the average inter-pulse delay and the average temperature is equal to or greater than the inter-pulse delay and temperature of the entry of the look-up table.

At operation 340, the processing logic calculates a media management metric based on the first scaling factor and the second scaling factor. As described previously, in one embodiment, the media management metric is calculated based on the addition of a product of the set/reset cycling count, the temperature factor, and the inter-pulse delay factor (e.g., set/reset cycling count*temperature factor*inter-pulse delay) and a product of a read cycling count and a wear ratio between read and write operation (e.g., applying a scaling factor to the read cycling counts due to disproportionate effects between read and write operations on the data unit).

At operation 350, responsive to determining that the media management metric satisfies a media management criterion, the processing logic performs a media management operation on the data unit at a predetermined cycle count. The media management criterion represents a plurality of media management thresholds (e.g., 0-50 k, 50 k-100 k, 100 k-150 k, 150 k-200 k, and 200 k+ media management metric or current age value) associated, respectively, with a media management trigger value (e.g. every 50, 40, 25, 15, 10, and 5 cycle counts) in which a media management operation is to be performed on the data unit every media management trigger value. Based on the satisfied media management threshold, the processing logic updates the predetermined cycle count with the media management trigger value. To determine that a media management metric satisfies a media management criterion, the processing logic determines that a media management metric of the data unit falls within a cycle count range corresponding to one of the plurality of media management thresholds. The media management operation comprises at least one of: wear leveling operation or SMU move.

Figure 4:
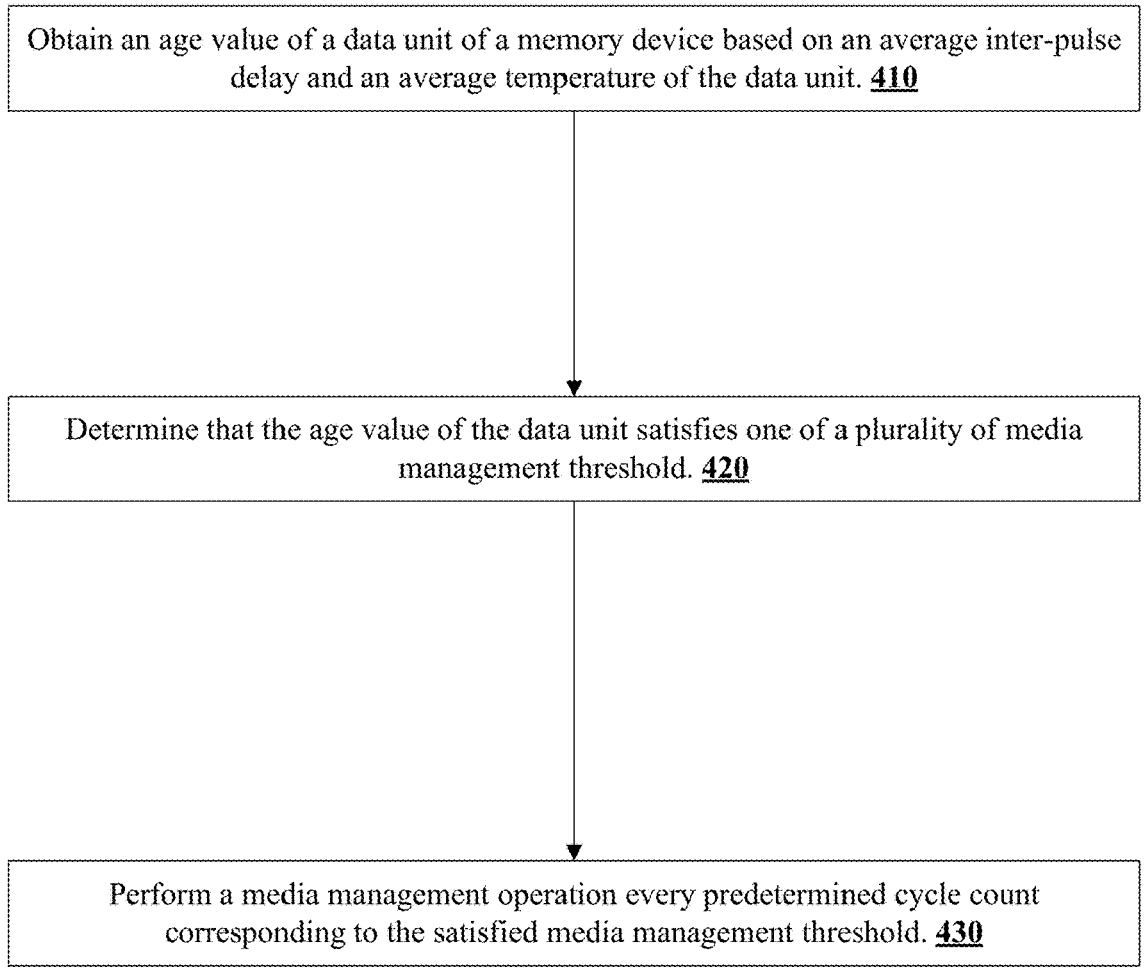
FIG. 4 is a flow diagram of another example method to identify a data unit of a memory device for performing a media management operation, in accordance with some embodiments of the present disclosure.

FIG. 4 is a flow diagram of an example method 400 to identify a data unit of a memory device for performing a media management operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic obtains an age value of a data unit of a memory device based on an average inter-pulse delay and an average temperature of the data unit. To obtain the age value of the data unit of the memory device based on the average inter-pulse delay and the average temperature of the data unit, the processing logic identifies a first entry of a look-up table corresponding to the average inter-pulse delay and a second entry of a look-up table corresponding to the average temperature. After identifying the first entry and the second entry, the processing logic extracts from the identified first entry and identified second entry a corresponding first scaling factor and a corresponding second scaling factor. The processing logic calculates, based on the first scaling factor and second scaling factor, the age value of the data unit.

As described previously, to calculate the average inter-pulse delay of the data unit, the processing logic obtains a first time stamp associated with a time stamp of a previous media management operation performed on the data unit and a second time stamp for each media access operation performed on the data unit associated with a time stamp of each media access operation performed after the first time stamp. Once the first time stamp and the second time stamp corresponding to each media access operation performed, the processing logic calculates an inter-pulse delay for each media access operation based on the first time stamp and the second time stamp of a respective media access operation. After each of the inter-pulse delay of each media access operations is calculated, the processing logic calculates an average inter-pulse delay of the data unit based on a number of media operation performed after the first time stamp and a sum of the inter-pulse delay for the respective media access operation.

As described previously, to calculate an average temperature of the data unit, the processing logic obtains a plurality of temperature values of the data unit corresponding to a temperature reading performed on the data unit every predetermined time period. After obtaining the plurality of temperature values of the data unit, the processing logic calculates the average temperature based on a number temperature readings performed and a sum of the respective temperature values.

As described previously, to obtain an age value of a data unit, the processing logic calculates the addition of a product of the set/reset cycling count, the temperature factor, and the inter-pulse delay factor (e.g., set/reset cycling count*temperature factor*inter-pulse delay) and a product of a read cycling count and a wear ratio between read and write operation (e.g., applying a scaling factor to the read cycling counts due to disproportionate effects between read and write operations on the data unit).

At operation 420, the processing logic determines that the age value of the data unit satisfies one of a plurality of media management threshold. As previously described, to determine that the age value of the data unit satisfies one of a plurality of media management thresholds (e.g., 0-50 k, 50 k-100 k, 100 k-150 k, 150 k-200 k, and 200 k+ media management metric or current age value) associated, respectively, with a media management trigger value (e.g. every 50, 40, 25, 15, 10, and 5 cycle counts), the processing logic determines which range the age value falls within.

At operation 430, the processing logic performs a media management operation every predetermined cycle count corresponding to the satisfied media management threshold. As described previously, the media management threshold represents a range in which a media management operation is to be performed on the data unit every media management trigger value. Based on the satisfied media management threshold, the processing logic updates the predetermined cycle count with the media management trigger value. The media management operation comprises at least one of: wear leveling operation or SMU move.

Figure 5:
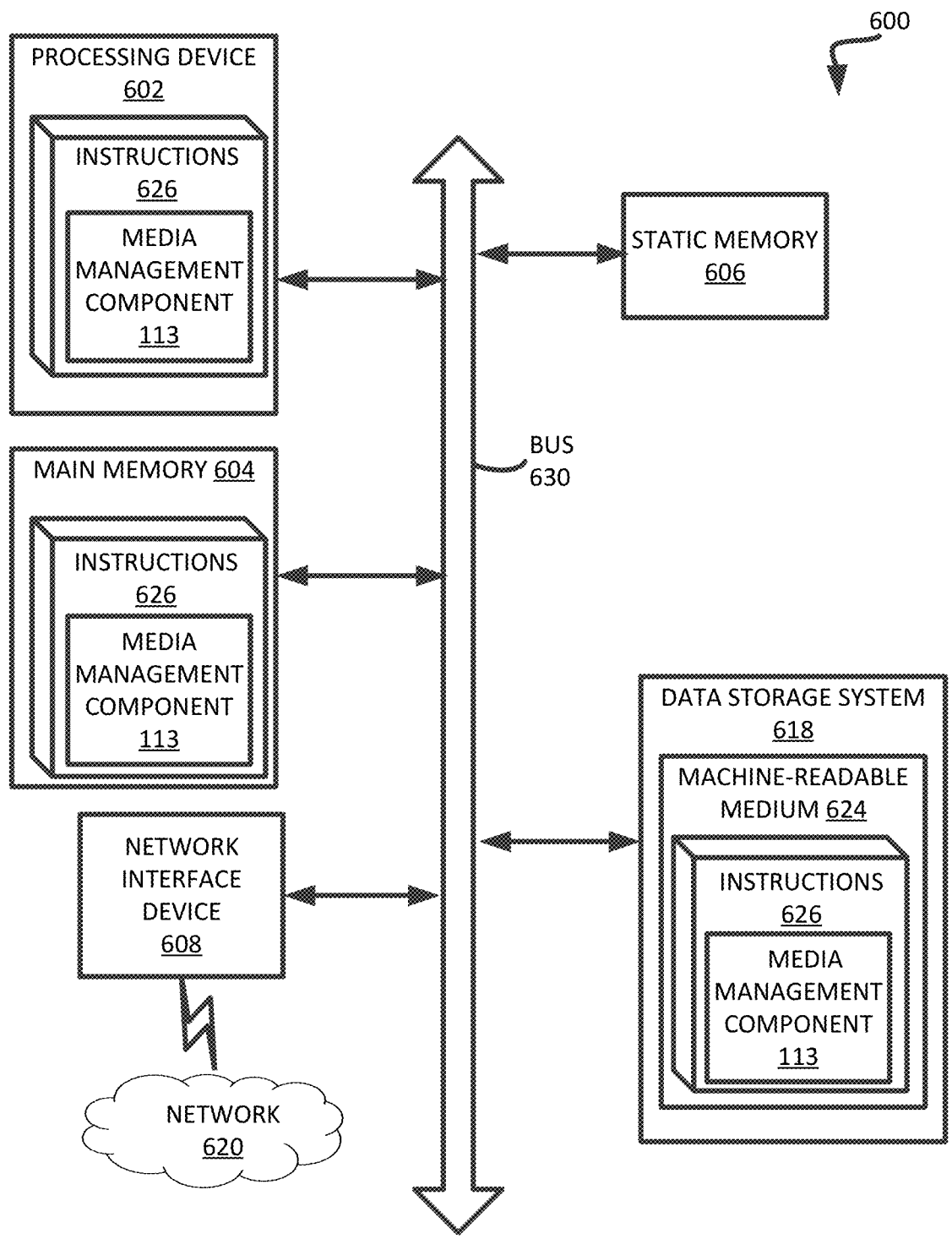
FIG. 5 is a block diagram of an example computer system in which embodiments of the present disclosure may operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a media management component (e.g., the media management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device coupled to the memory device, the processing device to perform operations comprising:
calculating an average inter-pulse delay of a data unit of the memory device;
calculating an average temperature of the data unit;
obtaining a first scaling factor based on the average inter-pulse delay and a second scaling factor based on the average temperature;
calculating a media management metric based on the first scaling factor and the second scaling factor;
responsive to determining that the media management metric satisfies a media management threshold of a media management criterion, updating a predetermined cycle count with a media management trigger value associated with the media management threshold; and
performing a media management operation on the data unit of the memory device at every updated predetermined cycle count.

2. The system of claim 1, wherein the media management criterion represents a plurality of media management thresholds each associated with a media management trigger value in which a media management operation is to be performed on the data unit every media management trigger value and wherein the predetermined cycle count is updated with the media management trigger value.

3. The system of claim 2, wherein determining that the media management metric satisfies the media management threshold of the media management criterion comprises:
determining that the media management metric falls within a cycle count range corresponding to one of the plurality of media management thresholds.

4. The system of claim 1, wherein calculating the average inter-pulse delay of the data unit comprises:
obtaining a first time stamp associated with a time stamp of a previous media management operation performed on the data unit;
obtaining a second time stamp for each media access operation performed on the data unit associated with a time stamp of each media access operation performed after the first time stamp;
calculating an inter-pulse delay for each media access operation based on the first time stamp and the second time stamp of a respective media access operation; and
calculating the average inter-pulse delay of the data unit based on a number of media operation performed after the first time stamp and a sum of the inter-pulse delay for the respective media access operation.

5. The system of claim 1, wherein calculating the average temperature of the data unit comprises:
obtaining a plurality of temperature values of the data unit, wherein each temperature value corresponds to a temperature reading performed on the data unit every predetermined time period; and
calculating the average temperature based on a number temperature readings performed and a sum of the respective temperature values.

6. The system of claim 1, wherein obtaining the first scaling factor based on the average inter-pulse delay comprises:
identifying an entry of a look-up table corresponding to the average inter-pulse delay; and
extracting, from the identified entry, the first scaling factor.

7. The system of claim 1, wherein obtaining the second scaling factor based on the average temperature comprises:

identifying an entry of a look-up table corresponding to the average temperature; and extracting, from the identified entry, the second scaling factor.

8. The system of claim 1, wherein the media management operation comprises at least one of: wear leveling operation or super management unit (SMU) move.

9. A method comprising:
calculating an average inter-pulse delay of a data unit of the memory device;
calculating an average temperature of the data unit;
obtaining a first scaling factor based on the average inter-pulse delay and a second scaling factor based on the average temperature;
calculating a media management metric based on the first scaling factor and the second scaling factor;
responsive to determining that the media management metric satisfies a media management threshold of a media management criterion, updating a predetermined cycle count with a media management trigger value associated with the media management threshold; and
performing a media management operation on the data unit of the memory device at every updated predetermined cycle count.

10. The method of claim 9, wherein the media management criterion represents a plurality of media management thresholds each associated with a media management trigger value in which a media management operation is to be performed on the data unit every media management trigger value and wherein the predetermined cycle count is updated with the media management trigger value.

11. The method of claim 10, wherein determining that the media management metric satisfies the media management threshold of the media management criterion comprises:
determining that the media management metric falls within a cycle count range corresponding to one of the plurality of media management thresholds.

12. The method of claim 9, wherein calculating the average inter-pulse delay of the data unit comprises:
obtaining a first time stamp associated with a time stamp of a previous media management operation performed on the data unit;
obtaining a second time stamp for each media access operation performed on the data unit associated with a time stamp of each media access operation performed after the first time stamp;
calculating an inter-pulse delay for each media access operation based on the first time stamp and the second time stamp of a respective media access operation; and
calculating the average inter-pulse delay of the data unit based on a number of media operation performed after the first time stamp and a sum of the inter-pulse delay for the respective media access operation.

13. The method of claim 9, wherein calculating the average temperature of the data unit comprises:
obtaining a plurality of temperature values of the data unit, wherein each temperature value corresponds to a temperature reading performed on the data unit every predetermined time period; and
calculating the average temperature based on a number temperature readings performed and a sum of the respective temperature values.

14. The method of claim 9, wherein obtaining the first scaling factor based on the average inter-pulse delay comprises:
identifying an entry of a look-up table corresponding to the average inter-pulse delay; and
extracting, from the identified entry, the first scaling factor.

15. The method of claim 9, wherein obtaining the second scaling factor based on the average temperature comprises:
identifying an entry of a look-up table corresponding to the average temperature; and
extracting, from the identified entry, the second scaling factor.

16. The method of claim 9, wherein the media management operation comprises at least one of: wear leveling operation or super management unit (SMU) move.

17. A non-transitory computer-readable storage medium comprising instructions that, when executed by a processing device, cause the processing device to perform operations comprising:
obtaining an age value of a data unit of a memory device based on an average inter-pulse delay and an average temperature of the data unit;
determining that the age value of the data unit satisfies one of a plurality of media management thresholds of a media management criterion;
responsive to determining that the age value of the data unit satisfies a media management threshold of the media management criterion, updating a predetermined cycle count with a media management trigger value associated with the media management threshold; and
performing a media management operation on the data unit of the memory device at every updated predetermined cycle count.

18. The non-transitory computer-readable storage medium of claim 17, wherein determining that the age value of the data unit satisfies one of the plurality of media management thresholds comprises:
determining that the age value of the data unit falls within a range corresponding to one of the plurality of media management thresholds.

19. The non-transitory computer-readable storage medium of claim 17, wherein obtaining the age value of the data unit of the memory device based on the average inter-pulse delay and the average temperature of the data unit comprises:
identifying a first entry of a look-up table corresponding to the average inter-pulse delay;
identifying a second entry of a look-up table corresponding to the average temperature;
extracting, from the identified first entry and identified second entry, a first scaling factor and a second scaling factor; and
calculating, based on the first scaling factor and second scaling factor, the age value of the data unit.

20. The non-transitory computer-readable storage medium of claim 17, wherein the media management operation comprises at least one of: wear leveling operation or super management unit (SMU) move.

* * * * *